United States Patent
Lin et al.

(10) Patent No.: US 12,438,022 B2
(45) Date of Patent: Oct. 7, 2025

(54) METHOD AND APPARATUS FOR SECURING SEMICONDUCTOR DEVICE CARRYING BOAT IN MULTI-BOAT TRAY

(71) Applicant: Taiwan Semiconductor Manufacturing Company, Ltd., Hsinchu (TW)

(72) Inventors: Chun-Yu Lin, Taichung (TW); Chih-Hung Huang, Hsinchu (TW); Yu-Chen Chen, Hemei (TW); Cheng-Lung Wu, Zhunan (TW); Jiun-Rong Pai, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 897 days.

(21) Appl. No.: 17/677,142

(22) Filed: Feb. 22, 2022

(65) Prior Publication Data
US 2023/0268210 A1    Aug. 24, 2023

(51) Int. Cl.
*H01L 21/67* (2006.01)
*H01L 21/673* (2006.01)

(52) U.S. Cl.
CPC .. *H01L 21/67309* (2013.01); *H01L 21/67333* (2013.01)

(58) Field of Classification Search
CPC ........ H01L 21/67309; H01L 21/67333; H05K 13/0084; H05K 13/0413; H05K 2201/10393; H05K 7/12
See application file for complete search history.

(56) References Cited

U.S. PATENT DOCUMENTS

| | | | | | |
|---|---|---|---|---|---|
| 3,613,983 | A | * | 10/1971 | Gage | B23K 20/121 228/114.5 |
| 6,955,197 | B2 | * | 10/2005 | Elliott | H01L 21/67778 414/331.14 |
| 12,142,504 | B2 | * | 11/2024 | Irisawa | B65G 49/061 |

* cited by examiner

*Primary Examiner* — Ronald P Jarrett
(74) *Attorney, Agent, or Firm* — Lippes Mathias LLP (57) ABSTRACT

A tray of an automated handling system for transporting semiconductor devices includes: a receiving region that is configured to receive a boat, the boat carrying one or more semiconductor devices thereon; and a clamping mechanism that selectively clamps the boat, residing in the receiving region, to the tray. Suitably, the clamping mechanism is automatically disengaged when the tray is positioned in a designated location and automatically engaged when the tray is not positioned in the designated location, such that, when engaged, the clamping mechanism holds the boat, residing in the boat receiving region, securely within the tray, and when disengaged, the clamping mechanism releases the boat residing in the boat receiving region.

20 Claims, 7 Drawing Sheets

METHOD AND APPARATUS FOR SECURING SEMICONDUCTOR DEVICE CARRYING BOAT IN MULTI-BOAT TRAY

BACKGROUND

The following relates to the semiconductor arts, and in particular, to a method and apparatus for transporting and/or handling semiconductor devices during the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices, for example, such as Metal-Oxide-Semiconductor Field-Effect Transistor (MOSFET) devices, Fin Field-Effect Transistor (FinFET) devices, Gate All Around Field-Effect Transistor (GAA-FET) devices, Integrated Circuits (ICs), etc. are manufactured and/or fabricated from and/or on semiconductor wafers and/or suitable substrates in a semiconductor fabrication plant, commonly referred to as a FAB or foundry. There are commonly many processing steps applied to the semiconductor wafer or substrate to produce a desired semiconductor device and/or numerous semiconductor devices on a wafer or suitable substrate. For example, semiconductor fabrication can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer. Accordingly, a FAB clean room or other like space where semiconductor device fabrication takes place typically contains many individual pieces of machinery and/or tools for semiconductor device production, for example, without limitation, such as steppers and/or scanners for photolithography, in addition to tools for material deposition, etching, cleaning, doping, testing, inspecting, dicing, wafer annealing, etc. and load ports or the like for temporary staging and/or storage of semiconductor wafers and/or devices. During the fabrication process which may include, without limitation: front-end-of-line (FEOL) process steps, a middle-end-of-line (MEOL) process steps, a back-end-of-line (BEOL) process steps, die preparation process steps and/or a semiconductor and/or IC packaging process steps, semiconductor wafers and/or devices are commonly transported from tool to tool and/or otherwise transferred to and/or from processing and/or holding chambers of various tools and/or equipment using an automated handling system (AHS). For example, such automated handling systems may include, without limitation, one or more of: an Equipment Front End Module (EFEM), robotic arms, linear conveyors, rotating conveyors or turn tables, grippers, overhead transport (OHT), and the like.

For efficiency and/or to increase throughput in the semiconductor manufacturing process, one or more semiconductor devices may be arranged and/or contained in an individual carrier, known as a boat, so that the semiconductor devices within the boat may be simultaneously transported, handled and/or processed at various stages of the semiconductor manufacturing process. A boat may, for example, be made of quartz or another material that can withstand processing conditions such as high thermal temperature, exposure to various gases, and/or so forth. Moreover, at various stages within the manufacturing process, efficiency and/or throughput in the semiconductor manufacturing process may also be enhanced by similarly situating one or more boats within a larger individual tray provisioned to carry one or more boats. For example, the tray may be designed to be loaded into an OHT vehicle for transport between semiconductor processing or characterization tools.

In practice, at particular points in the semiconductor manufacturing process, a boat may be selectively emptied (i.e., semiconductor devices removed therefrom), filled (i.e., semiconductor devices loaded therein) and/or re-used repeatedly in subsequent processing cycles and/or at various points within the same processing cycle. Likewise, at particular points in the semiconductor manufacturing process, a tray may be selectively emptied (i.e., boats removed therefrom), filled (i.e., boats loaded therein) and/or re-used repeatedly in subsequent processing cycles and/or at various points within the same processing cycle.

Suitably, in accordance with some embodiments disclosed herein, an individual tray is formed with one or more receiving wells or regions in which one or more boats may be selectively placed. Advantageously, each receiving well or region is sized appropriately for the individual boat being received therein. In some suitable embodiments, one or more inner dimensions of a tray's receiving well or region may be slightly larger than the corresponding outer dimensions of a boat received therein. One advantage of this slight difference or tolerance is that it may permit and/or facilitate the boat to be readily placed and/or fit within the receiving region of the tray, for example, with less than absolute precision, and in turn, demands on the precision of an automated handling device placing and/or fitting the boat in a receiving well or region within the tray may be alleviated. However, this slight difference or tolerance between the one or more inner dimensions of the receiving well or region and the one or more outer dimensions of the boat may potentially allow a boat to move, vibrate, shake and/or rattle about within the receiving well or region of the tray, for example, when the tray is being transported and/or otherwise handled, and particularly, when a tray is rotated or moved at high speed.

Accordingly, in some suitable embodiments disclosed herein, a tray is provisioned with one or more clamping mechanisms that selectively secure one or more boats carried in the tray. One advantage of such a clamping mechanism is that the boats are not free to move, vibrate, shake or rattle about within the tray as the tray is being moved, transported or otherwise handled, hence, the clamping mechanism aids in avoiding and/or mitigating the potential for damage to the semiconductor devices carried in the boats, which damage might otherwise result from such movement, vibration, shaking or rattling of the boat within the tray. That is to say, advantageously, the clamping mechanisms may be selectively employed to stabilize the boats within the tray when the tray is being transported and/or otherwise handled, while still permitting suitable tolerances to exist between the inner dimensions of the receiving well or region and the outer dimensions of the boat, which tolerances facilitate the boat being readily placed and/or fit within the receiving well or region.

A further advantage of the clamping mechanisms disclosed herein is that the clamping mechanism may move and/or secure the boat to a relatively precise location with respect to the tray, and hence, the location of semiconductor devices within the boat may be more precisely known and/or sufficiently controlled in repetitive fashion, which can aid in subsequent processing of the semiconductor devices. That is to say, the clamping mechanisms may move and/or secure a boat to a particular location within the receiving well or region that the boat was placed and do so repeatedly and reliably with each subsequent use of the tray.

In some suitable embodiments, the clamping mechanism is a primarily mechanically driven, non-powered (i.e., not powered or driven electrically, magnetically, pneumatically or hydraulically) mechanism that selectively engages and/or disengages automatically as the tray is otherwise moved, transported and/or handled. An advantage of such a mechanically driven clamping mechanism is that it remains relatively simple and/or uncomplicated to implement and it may be readily provided on a tray which remains highly portable and may withstand the different environments (for example, such as a relatively high temperature environment) to which the tray may be exposed during various semiconductor manufacturing process steps. For example, the tray in some embodiments does not include a power source for driving the clamping mechanism.

Figure 1:
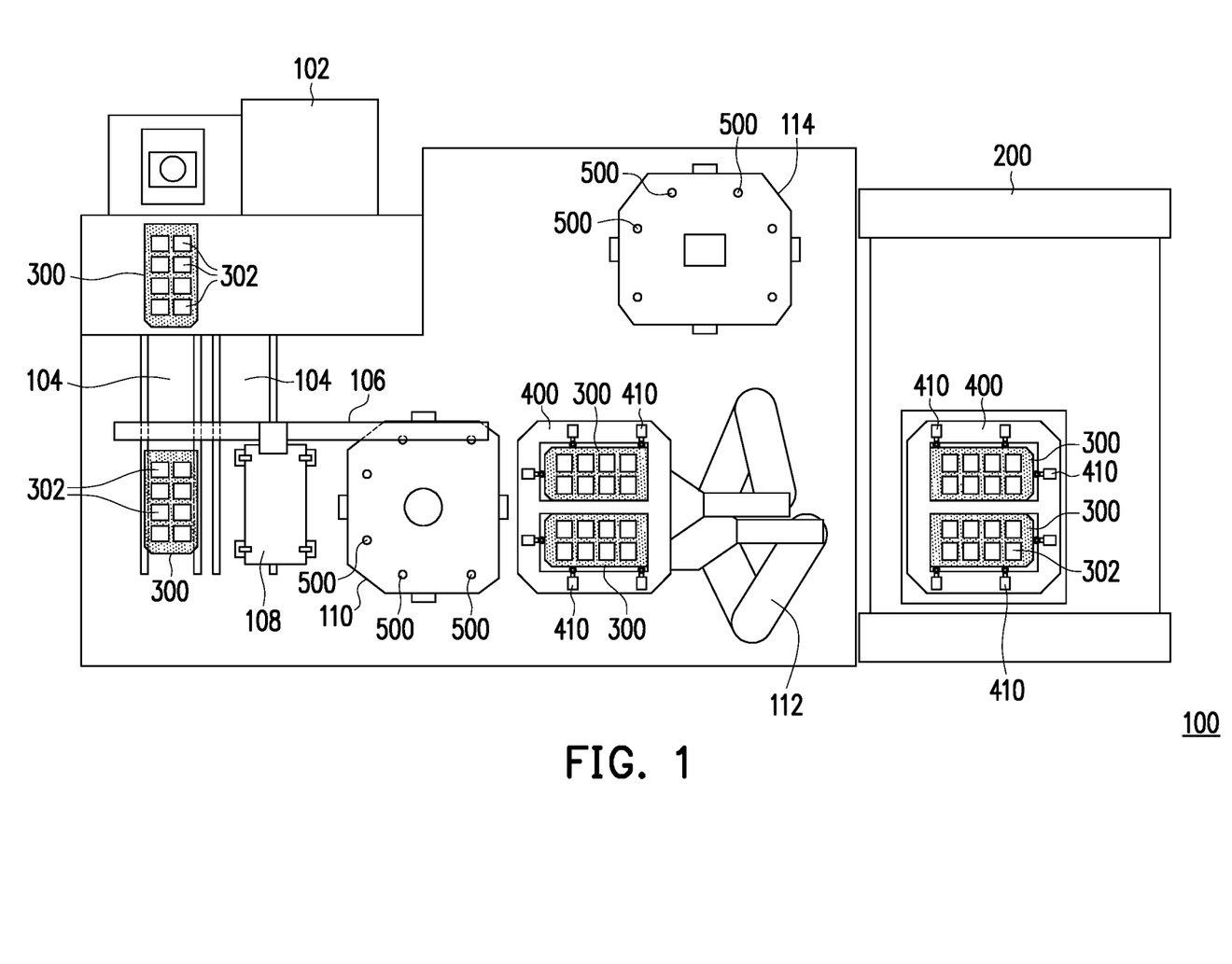
FIG. 1 diagrammatically illustrates a top view of an automated handling system (AHS) for transporting semiconductor devices in accordance with some embodiments disclosed herein.

In accordance with some suitable embodiments disclosed herein, FIG. 1 shows an automated handling system (AHS) 100 for transporting and/or otherwise handling semiconductor devices during a semiconductor manufacturing process. In some suitable embodiments, the AHS 100 may include, without limitation: (i) a magazine load port (MLP) 102 or the like; (ii) one or more conveyor lanes 104 or the like; (iii) a linear table or stage 106 or the like; (iv) automated grippers 108 or the like; (v) a turn table or stage 110 or the like; (vi) an EFEM, for example, including a dual-arm robot 112, or the like; and (vii) a buffer table or stage 114 or the like. FIG. 1 also show a process tool 200 that applies one or more semiconductor manufacturing process steps (including, for example, testing) to semiconductor devices loaded therein, for example, including without limitation: a front-end-of-line (FEOL) process step, a middle-end-of-line (MEOL) process step, a back-end-of-line (BEOL) process step, a die preparation process step and/or a semiconductor and/or IC packaging process step. It will be appreciated that a given embodiment may include a subset of these handling equipment, and/or may include other types of handling equipment besides the above nonlimiting illustrative examples.

In some suitable embodiments, the MLP 102 may temporarily store and/or house one or more semiconductor device carrying boats 300. In practice, each boat 300 may carry one or more semiconductor devices 302 therein. For example, each semiconductor device 302 may be, without limitation, a MOS-FET device, a FinFET device, a GAA-FET device, IC, etc. In one typical example, each semiconductor device 302 may be an IC fabricated (or in the process of fabrication) on a silicon wafer, silicon-on-insulator (SOI) wafer, or so forth, and the circuitry of the IC of each device 302 may include various electronic components such as MOS-FETs, FinFETs, GAA-FETs, capacitors, and/or so forth. Depending on the stage of the processing, each semiconductor device 302 may be a full wafer (e.g. silicon, SOI, or other semiconductor wafer), or each device 302 may be a chip diced from such a wafer. For illustrative purposes, as shown, each boat 300 is carrying 8 semiconductor devices 302 therein. In practice, each boat 300 may carry more or less than 8 semiconductor devices 302. In some nonlimiting illustrative embodiments, each boat 300 is configured to carry between 1 semiconductor device 302 and 32 semiconductor devices 302.

In some suitable embodiments, the boats 300 are in turn selectively unloaded from the MLP 100, for example, being transported along and/or by one or more of the conveyor lanes 104. The automated grippers 108 are operably movable along the linear table 106 and may selectively retrieve the boats 300, for example, from an end of the conveyor lanes 104 and selectively place one or more of the retrieved boats 300 in a tray 400, for example, positioned on and/or located atop the turn table 110. In some suitable embodiments, the robot 112 may selectively retrieve the tray 400 from the turn table 110 and load the retrieved tray 400 into the process tool 200, for example, placing and/or putting the tray 400 into a chamber of the process tool 200. Alternatively, the robot 112 may selectively place and/or put a retrieved tray 400 on or atop the buffer table 114.

For illustrative purposes, in FIG. 1, the robot 112 is shown holding a tray 400 and a tray 400 is shown residing in the process tool 200. However, in practice, at various times, the tray 400 may in fact reside and/or rest upon the turn table 110 and/or the buffer table 114.

Figure 2:
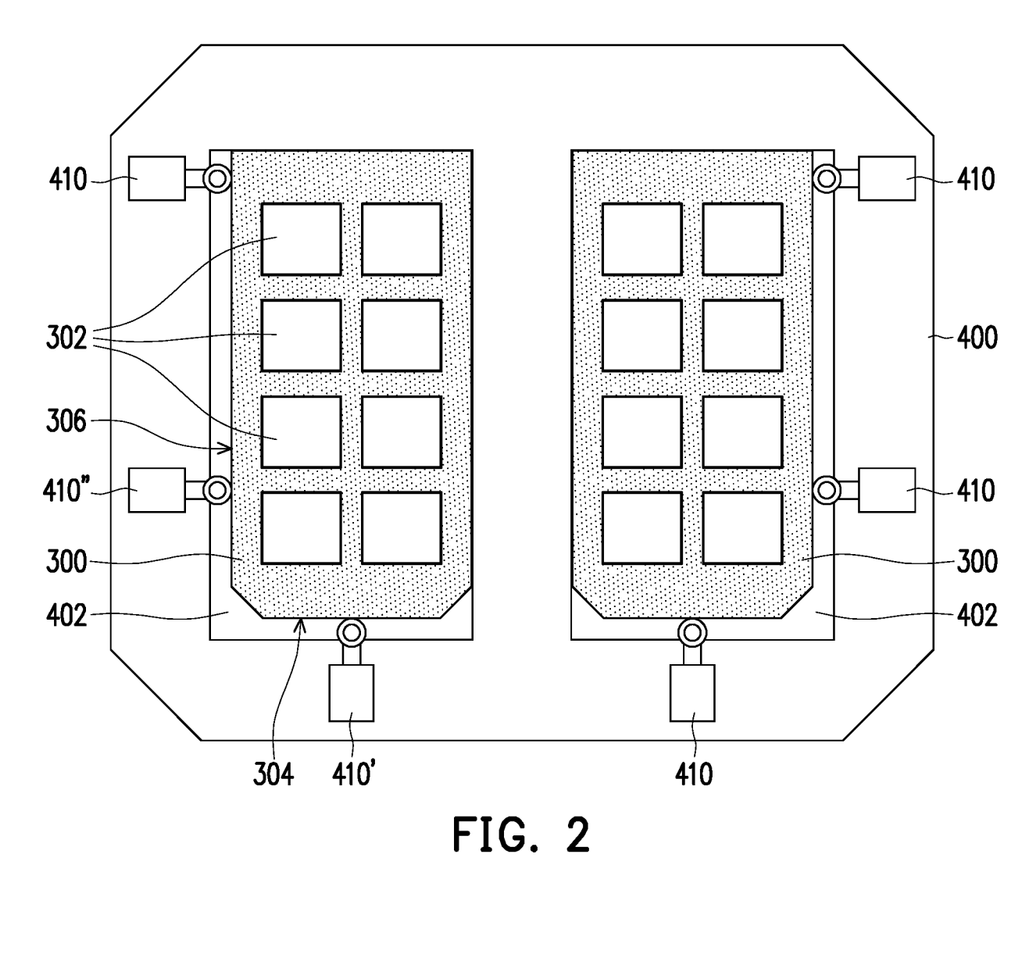
FIG. 2 diagrammatically illustrates a top view of a tray in accordance with some embodiments disclosed herein.

FIG. 2 shows a tray 400 with boats 300 residing therein. Suitably, each tray 400 includes one or more boat receiving wells or regions 402 into which a boat 300 may be selectively placed, for example, by the automated grippers 108. In practice, each receiving well or region 402 may be sized slightly larger than an individual boat 300 being received therein. That is to say, for example, in some suitable embodiments, one or more inner dimensions of a tray's receiving well or region 402 may be slightly larger than the corresponding outer dimensions of a boat 300 received therein. Accordingly, this slight difference or tolerance between the respective sizes and/or dimensions may permit and/or facilitate the boat 300 to be readily placed and/or fit within the receiving well or region 402 of the tray 400.

For illustrative purposes, in FIG. 2, the tray 400 is shown having 2 boat receiving wells or regions 402. In practice, each tray 400 may have more or less than 2 boat receiving wells or regions 402.

In some suitable embodiments, the tray 400 is provisioned with one or more selectively engageable clamping mechanisms 410. For illustrative purposes, in FIG. 2, the tray 400 is shown having 6 clamping mechanisms 410, with three clamping mechanisms 410 engaging each boat 300. In practice, each tray 400 may have more or less than 6 clamping mechanisms 410. Suitably, the tray 400 may have one or more clamping mechanisms 410 associated with each boat receiving well and/or region 402 of the tray 400. In suitable embodiments, the clamping mechanisms 410 selectively secure one or more boats 300 carried in the tray 400 so that the boats 300 are not free to move, vibrate, shake or rattle about within the tray 400, for example, as the tray 400 is being moved, transported or otherwise handled, for example, by the robot 112. That is to say, the clamping mechanisms 410 may be selectively employed to stabilize the boats 300 within the tray 400 when the tray 400 is being transported and/or otherwise handled, while still permitting suitable tolerances to exist, for example, between one or more inner dimensions of the receiving well or region 402 and one or more corresponding outer dimensions of the boat 300.

Figure 4:
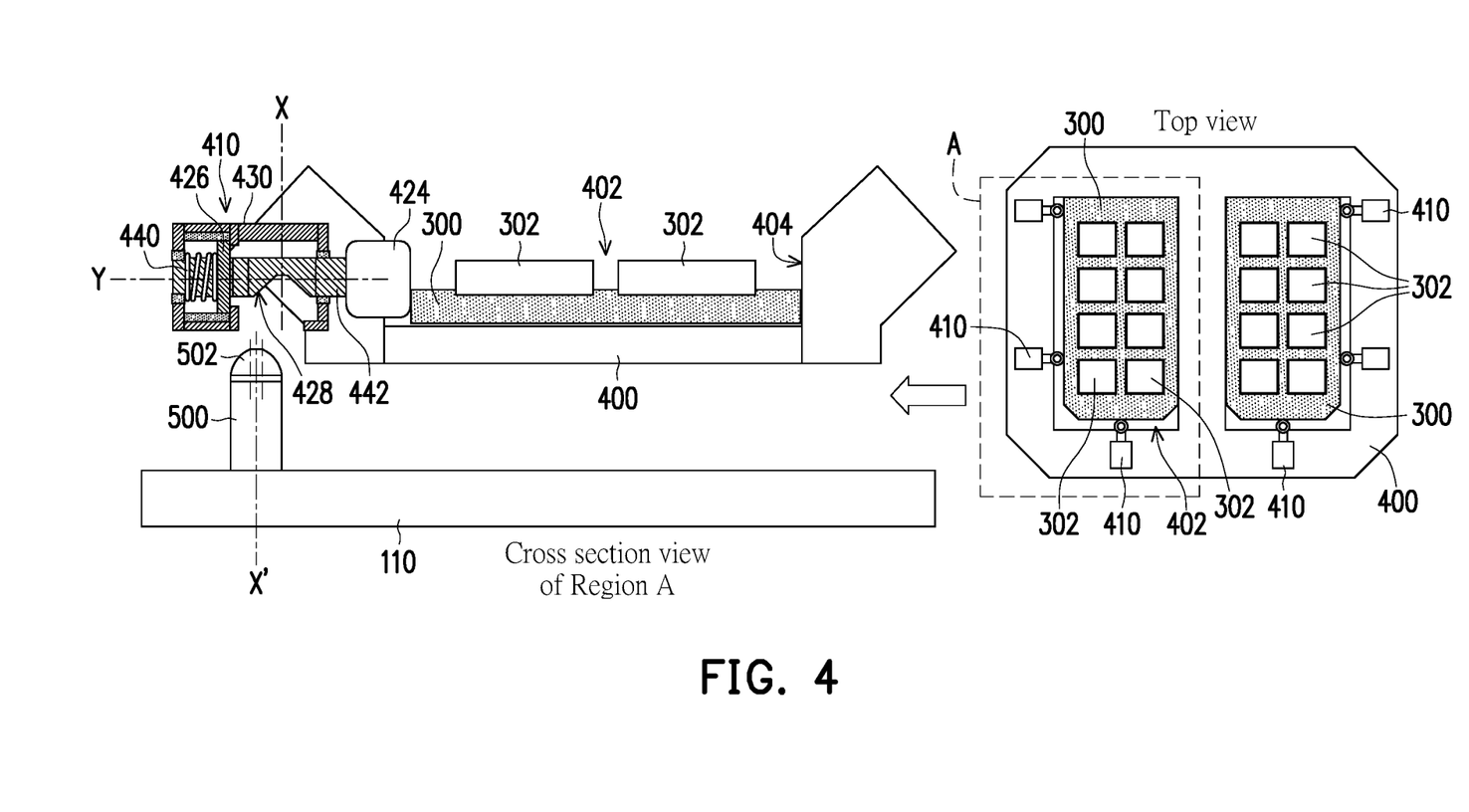
FIG. 4 diagrammatically illustrates a clamp or clamping mechanism in its engaged state in accordance with some embodiments disclosed herein.
Figure 5:
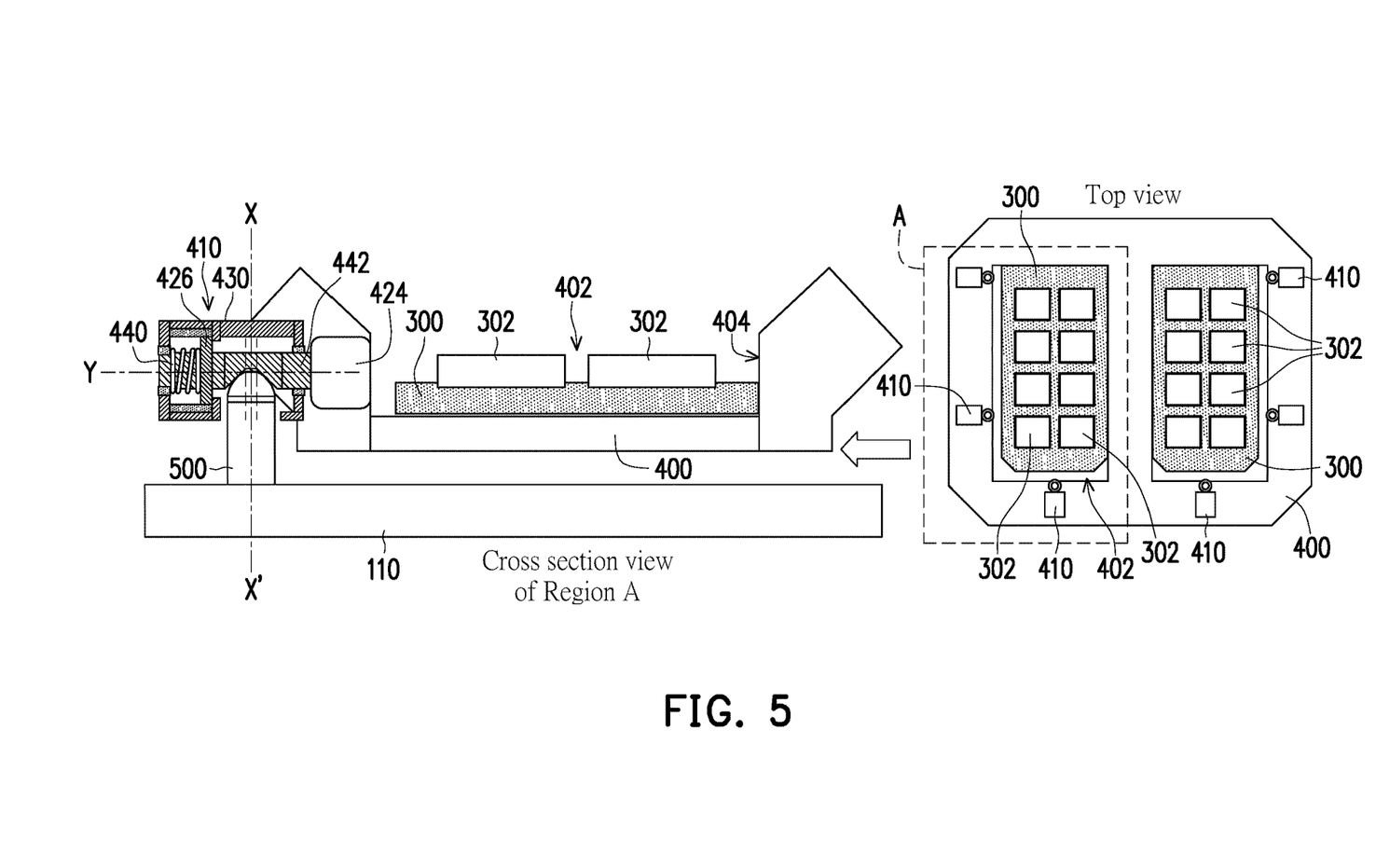
FIG. 5 diagrammatically illustrates a clamp or clamping mechanism in its disengaged state in accordance with some embodiments disclosed herein.

The clamping mechanisms 410, in some suitable embodiments, are arranged to automatically engage (i.e., secure boats 300 within the tray 400) and automatically disengage (i.e., release boats 300 within the tray 400) in response to and/or depending upon a position and/or state of the tray 400. More specifically, as can be seen in FIG. 5, when the tray 400 rests, resides in and/or is set upon one or more designated locations, for example, such as the turn table 110 or the buffer table 114, the clamping mechanisms 410 are disengaged, i.e., the clamping mechanisms 410 do not actively hold the boats 300 or secure the boats 300 to the tray 400. Conversely, as can be seen in FIG. 4, when the tray 400 is removed from and/or does not reside in the designated locations, for example, when the tray 400 is lifted and/or removed from the turn table 110 and/or buffer table 114 to be transported and/or handled by the robot 112, the clamping mechanisms 410 are engaged, i.e., the clamping mechanisms 410 do actively hold the boats 300 and secure the boats 300 to the tray 400.

In some suitable embodiments, the turn table 110 has one or more posts or guide pins 500 thereon, for example, extending upward from a tabletop or surface where the tray 400 is selectively positioned and/or located when the tray 400 is resting or placed upon the turn table 110. For illustrative purposes, in FIG. 1, the turn table 110 is shown having 6 pins 500, which correspond to the six clamping mechanisms 410 of the tray 400. In practice, the turn table 110 may have more or less than 6 pins 500. Suitably, the pins 500 are arranged on the turn table 110 so as to extend into, engage and/or cooperate with corresponding clamping mechanisms 410 to cause disengagement of the clamping mechanisms 410 when the tray 400 is placed and/or resides upon the turn table 110 (for example, as seen in FIG. 5). Conversely, when the tray 400 is removed from and/or does not reside upon the turn table 110 (for example, as seen in FIG. 4), the pins 500 are removed and/or disengaged from the clamping mechanisms 410 and/or no longer cooperating therewith, such that the clamping mechanisms 410 are free to transition into their engaged states, i.e., in which they hold and/or secure boats 300 to the tray 400.

Likewise, the buffer table 114 may have one or more posts or guide pins 500 thereon, for example, extending upward from a tabletop or surface where the tray 400 is selectively positioned and/or located when the tray 400 is resting or placed upon the buffer table 114. As with the turn table 110, the pins 500 are arranged on the buffer table 114 suitably so as to extend into, engage and/or cooperate with corresponding clamping mechanisms 410 to cause disengagement of the clamping mechanisms 410 when the tray 400 is placed and/or resides upon the buffer table 114. Conversely, when the tray 400 is removed from and/or does not reside upon the buffer table 114, the pins 500 of the buffer table 114 are removed and/or disengaged from the clamping mechanisms 410 and/or no longer cooperating therewith, such that the clamping mechanisms 410 are free to transition to their engaged states, i.e., where they hold and/or secure boats 300 to the tray 400. For illustrative purposes, in FIG. 1, the buffer table 114 is shown having 6 pins 500. In practice, the buffer table 114 may have more or less than 6 pins 500.

Figure 3:
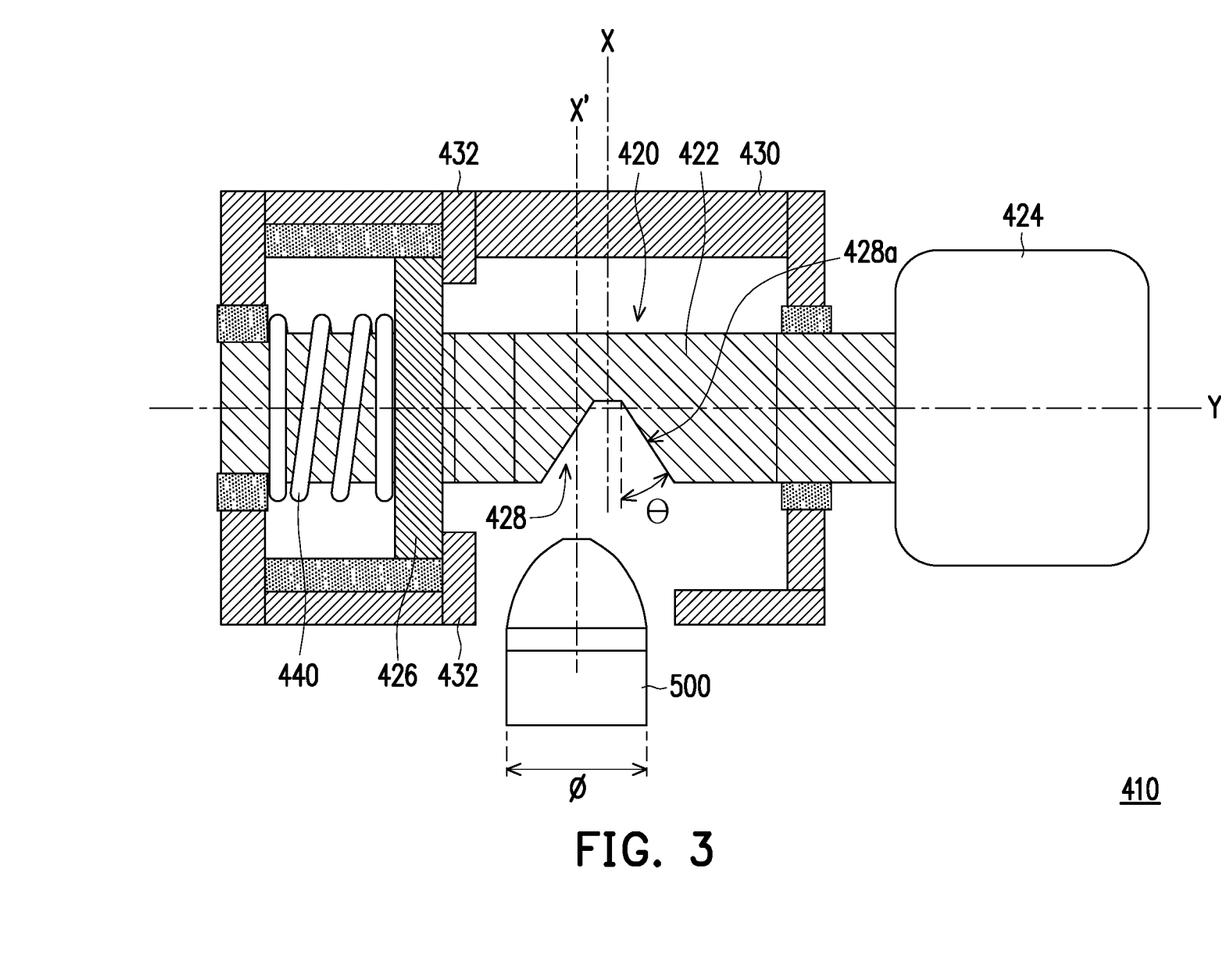
FIG. 3 diagrammatically illustrates a cross section view of a clamp or clamping mechanism in accordance with some embodiments disclosed herein.

FIG. 3 shows an exemplary clamping mechanism 410 in greater detail. Suitably, each clamping mechanism 410 includes a piston or plunger 420 having (i) a shaft 422 with a central axis Y extending in a horizontal or lateral direction and (ii) a boat-contacting head 424 arranged at a first end of the shaft 422. The shaft 422 of the plunger 420 is suitably contained and/or arranged within a mechanism housing 430 such that the boat-contacting head 424 of the plunger 420 resides and/or extends outside the housing 430. At or near a second end of the shaft 422, opposite the first end, an annular lip or flange 426 may be arranged around the shaft 422 within the housing 430. As shown, a coil spring 440 or other like biasing member (for example, without limitation, a leaf spring or other resiliently compressible and/or deformable member) is arranged and/or compressed between the flange 426 and a wall of the housing 430, for example, so as to supply a mechanical force urging, biasing and/or pushing the plunger 420 along the Y axis in a direction of the plunger's head 424 which resides and/or extends outside of the housing 430. Suitably, an annular ring 432 extending inward from the hosing 430 cooperates with the flange 426 to limit movement of the plunger 420 in the direction of the plunger's head 424.

As shown, a pocket or notch 428 is also formed in the shaft 422, for example, between the flange 426 and the head 424 of the plunger 420. Suitably, the notch 428 has (i) a central vertical axis X, for example, which is substantially normal to the horizontal or lateral Y axis, and (ii) a sloped side wall or surface 428a, for example, which extends at an angle θ with respect to the X axis. In some nonlimiting illustrative embodiments, the angle θ is in a range of between greater than or equal to about 20 degrees and less than or equal to about 70 degrees.

In some suitable embodiments, an opening is arranged and/or provided in the housing 430 to selectively receive therethrough a post or guide pin 500. For example, the aforementioned opening in the housing 430 may be located on a bottom of the housing 430. In some suitable embodiments, the pin 500 has a diameter Ø (for example, greater than or equal to about 2 mm in some nonlimiting illustrative embodiments) and a rounded or tapered end 502 (for example, distal from the turn table 110 and/or buffer table 114 from which the pin 500 extends) configured to contact and/or engage with the mated pocket or notch 428 formed in the shaft 422 as the clamping mechanism 410 and/or housing 430 is lowered over the pin 500, for example, when the tray 400 is placed upon the turn table 110 or buffer table 114 (as shown in FIG. 5). Conversely, when the clamping mechanism 410 and/or housing 430 is raised away from the pin 500, for example, when the tray 400 is lifted off or removed from the turn table 110 or buffer table 114 by the robot 112 (as shown in FIG. 4), the pin 500 is removed, withdrawn and/or disengages from the notch 428.

Conversely, FIG. 5 diagrammatically illustrates a clamping mechanism 410 in its disengaged state, i.e., when the tray 400 is positioned and/or resting atop the turn table 110 such that a pin 500 extending from the turn table 110 is inserted into the corresponding clamping mechanism 410. More specifically, can be seen on one side of FIG. 5 there is a top view of the tray 400 and on the other side of FIG. 5 there is a cross section view of the region A.

Conversely, FIG. 5 diagrammatically illustrates a clamping mechanism 410 in its disengaged engaged state, i.e., when the tray 400 is positioned and/or resting atop the turn table 110 such that a pin 500 extending from the turn table 110 is inserted into the corresponding clamping mechanism 410. More specifically, can be seen on one side of FIG. 5 there is a top view of the tray 400 and on the other side of FIG. 5 there is a cross section view of the region A.

With reference again to FIG. 3, when the clamping mechanism 410 is in its engaged state as shown, the axis X of the notch 428 may be offset (for example, by some distance in a direction of the Y axis) from a central vertical axis X' of the post 500. Conversely, when the clamping mechanism is in the disengage state (as can be seen in FIG. 5 for example), the plunger 420 is withdrawn and/or retained by the post 500 being received in the notch 428 and so the axis X of the notch 428 and the axis X' of the post 500 may substantially coincide in that case.

As shown in FIG. 4, in practice, when the clamping mechanism 410 and/or housing 430 is raised away from the pin 500 so that the pin 500 is removed, withdrawn and/or disengaged from the notch 428, the plunger 420 is free to move and/or extend, for example, along the Y axis, in the direction of the head 424 in accordance with the force imparted by the spring 440, at least to a limit prescribed by the cooperation of and/or interaction between the annular ring 432 with the flange 426. In this case, with the plunger 420 free to extend, the clamping mechanism 410 transitions into its engaged state. In some suitable embodiments, when the clamping mechanism 410 is in its engaged state, the boat 300, residing within the receiving region 402 of the tray 400, is pressed upon by the head 424 of the plunger 420 in accordance with the mechanical force supplied by the spring 440, as opposed to when the clamping mechanism 410 is held in its disengaged state (see, for example, FIG. 5), where the plunger 420 is withheld against the mechanical force imparted by the spring 440, for example, by the pin 500 being engaged with the notch 428, so that the head 424 of the plunger 420 does not press upon the boat 300 residing within the receiving region 402 of the tray 400. In this way, the clamping mechanisms 410 transition between the engaged and disengaged states without a power supply for operating the clamping mechanisms included in the tray 400. Rather, the driving force for operating the clamping mechanisms 410 is provided by the robotic or other automated placement or removal of the tray 400 onto or off a support such as the illustrative turn table 110 or buffer table 114.

In some suitable embodiments, as seen in FIG. 4, when a boat 300 resides with a receiving well or region 402 of the tray 400, and the clamping mechanism 410 is in its engaged state (for example, because the tray 400 is lifted off and/or removed from the turn table 110 or buffer table 114), the boat 300 is squeezed between the head 424 of the plunger 420 pressing thereupon and an opposing retaining wall or surface 404 of the tray 400, for example, which retaining wall or surface 404 may extend substantially vertical from a base of the tray 400. Conversely, as seen in FIG. 5, when the clamping mechanism 410 is in its disengaged state (for example, because the tray 400 rests and/or resides on the turn table 110 or buffer table 114), the plunger 420 is withheld against the mechanical force imparted by the spring 440 so that the head 424 of the plunger 420 does not press upon the boat 300 residing within the receiving well or region 402 of the tray 400.

In accordance with some embodiments, as seen in FIG. 2, the boats 300 may have a generally rectangular shape, i.e., including a first side 304 which shorter than a second side 306. Suitably, when a boat is place within a receiving well or region 402 of the tray 400, at least one clamping mechanism 410 (for example, nominally referred to as a first clamping mechanism and labeled with a corresponding primed reference numeral—i.e., 410' in FIG. 2) is arranged next to and/or along the first side 304 of the boat 300 and at least one other clamping mechanism 410 (for example, nominally referred to as a second clamping mechanism and labeled with a corresponding double primed reference numeral—i.e., 410" in FIG. 2) is arranged next to and/or along the second side 306 of the boat 300.

Accordingly, when a boat 300 resides within the receiving well and/or region 402 of the tray 400 and the first clamping mechanism 410' is in its engaged state, the plunger head 424 of the first clamping mechanism 410' presses upon the first side 304 of the boat 300, thereby squeezing the boat 300 between the plunger head 424 of the first clamping mechanism 410' and an opposing substantially vertical retaining surface and/or wall of the tray 400. Likewise, when a boat 300 resides within the receiving well and/or region 402 of the tray 400 and the second clamping mechanism 410" is in its engaged state, the plunger head 424 of the second clamping mechanism 410" presses upon the second side 306 of the boat 300, thereby squeezing the boat 300 between the plunger head 424 of the second clamping mechanism 410" and an opposing substantially vertical retaining surface and/or wall of the tray 400.

Conversely, when a boat 300 resides within the receiving well and/or region 402 of the tray 400 and the first clamping mechanism 410' is in its disengaged state, the plunger head 424 of the first clamping mechanism 410' does not press upon the first side 304 of the boat 300, such that the boat 300 is not squeezed between the plunger head 424 of the first clamping mechanism 410' and an opposing substantially vertical retaining surface and/or wall of the tray 400. Likewise, when a boat 300 resides within the receiving well and/or region 402 of the tray 400 and the second clamping mechanism 410" is in its disengaged state, the plunger head 424 of the second clamping mechanism 410" does not press upon the second side 306 of the boat 300, such that the boat 300 is not squeezed between the plunger head 424 of the second clamping mechanism 410" and an opposing substantially vertical retaining surface and/or wall of the tray 400.

In some suitable embodiments, the first clamping mechanism 401' and the second clamping mechanism 410" are coordinated to automatically transition from their disengaged states to their engaged states in a designated non-simultaneous, sequential order, for example when the tray 400 is removed from the turn table 110 and/or buffer table 114. In some suitable embodiments, the first clamping mechanism 410' transitions and/or begins transitioning to its engaged state before the second clamping mechanism 410" transitions and/or begins transitioning to its engaged state, for example when the tray 400 is lifted and/or removed from the turn table 110 and/or buffer table 114 by the robot 122.

In some suitable embodiments, the order and/or timing in which the various clamping mechanisms 410 are automatically transitioned from their disengaged states to their engaged states is coordinated, regulated and/or controlled by suitably differentiating the diameters Ø of the posts 500 and/or the angles θ of the notches' sloped surfaces 428a. For example, a diameter Ø1 the post 500 corresponding to the first clamping mechanism 410' may be greater than a diameter Ø2 the post 500 corresponding to the second clamping mechanism 410" and/or an angle θ1 of the sloped surface 428a for the notch 428 formed in the shaft 422 of the first clamping mechanism 410' may be greater than an angle θ2 of the sloped surface 428a for the notch 428 formed in the shaft 422 of the second clamping mechanism 410". Accordingly, when the tray 400 is lifted from the turn table 110 and/or buffer table 114, the first clamping mechanism 410' transitions and/or begins to transition from its disengaged state to its engaged state prior to the second clamping mechanism 410" transitioning and/or beginning to transition from its disengaged state to its engaged state.

As can be appreciated, when the boat 300 is squeezed in a first direction against a retaining wall or surface of the tray 400, friction therebetween resists movement of the boat 300 laterally with respect to the first direction. That friction is generally larger when a respective longer side of the boat 300 has a respective larger contact area with the retaining wall or surface of the tray 400, as compared to the friction which results when a relatively shorter side of the boat 300 would have a relatively smaller contact area with the retaining wall or surface of the tray 400. Accordingly, an advantage is achieved, by engaging the first clamping mechanism 410' arranged next to the shorter side 304 of the boat 300 prior to engaging the second clamping mechanism 410" arranged next to the longer side 306 of the boat 300, since the second clamping mechanism 410" only has to overcome the relatively smaller friction produced by the relatively shorter side of the boat 300 being pressed into contact with the opposing retaining wall or surface, i.e., due to a relatively smaller contact area between by the relatively shorter side of the boat 300 and the retaining wall or surface of the tray 400. In some suitable embodiments, the spring force of the spring 440 provided in the first clamping mechanism 410' may be different than the spring force of the spring 440 provided in the second clamping mechanism 410", for example, to accommodate the difference in friction between these two cases. In practice, for example, the spring force of the spring 440 provided in the first clamping mechanism 410' may be less than the spring force of the spring 440 provided in the second clamping mechanism 410".

Figure 6:
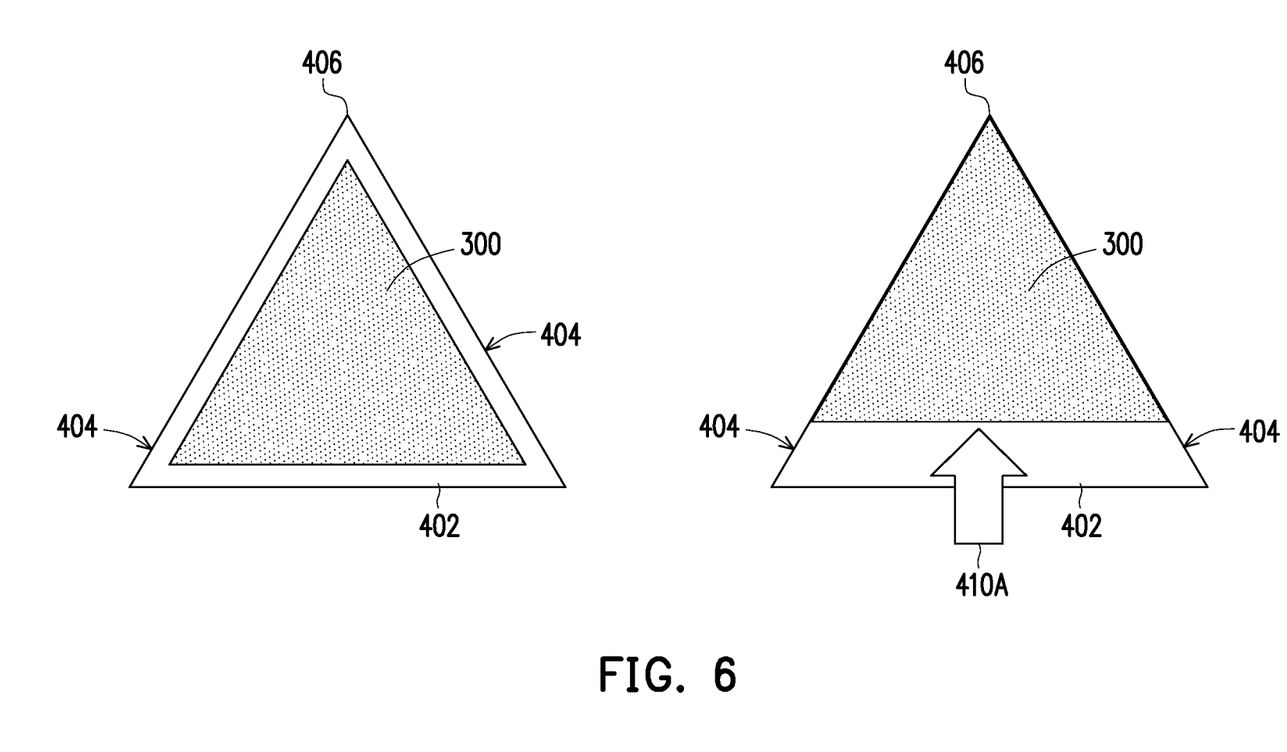
FIG. 6 diagrammatically illustrates an exemplary alternative shape of a boat and corresponding receiving well or region of a tray in accordance with some embodiments disclosed herein.

As shown in FIG. 6, in some suitable embodiments, the boats 300 and/or corresponding receiving wells and/or regions 402 of the tray 400 may have a generally polygonal shape other than generally rectangular. For example, where the shape of the boat 300 has an odd number of sides (for example, such as a triangle) and the retaining walls and/or surfaces 404 of the correspondingly shaped receiving well or region 402 meet at a corner 406, a single clamping mechanism 410 may be arranged opposite that corner 406 and employed to selectively squeeze the boat 300 into that corner 406. This has the advantage of not using multiple clamping mechanism 410 to selectively secure the boat 300 to the tray 400. For simplicity, the single clamping mechanism 410 is not shown in FIG. 6, rather the clamping action thereof is graphically represented by the arrow 410a.

Figure 7:
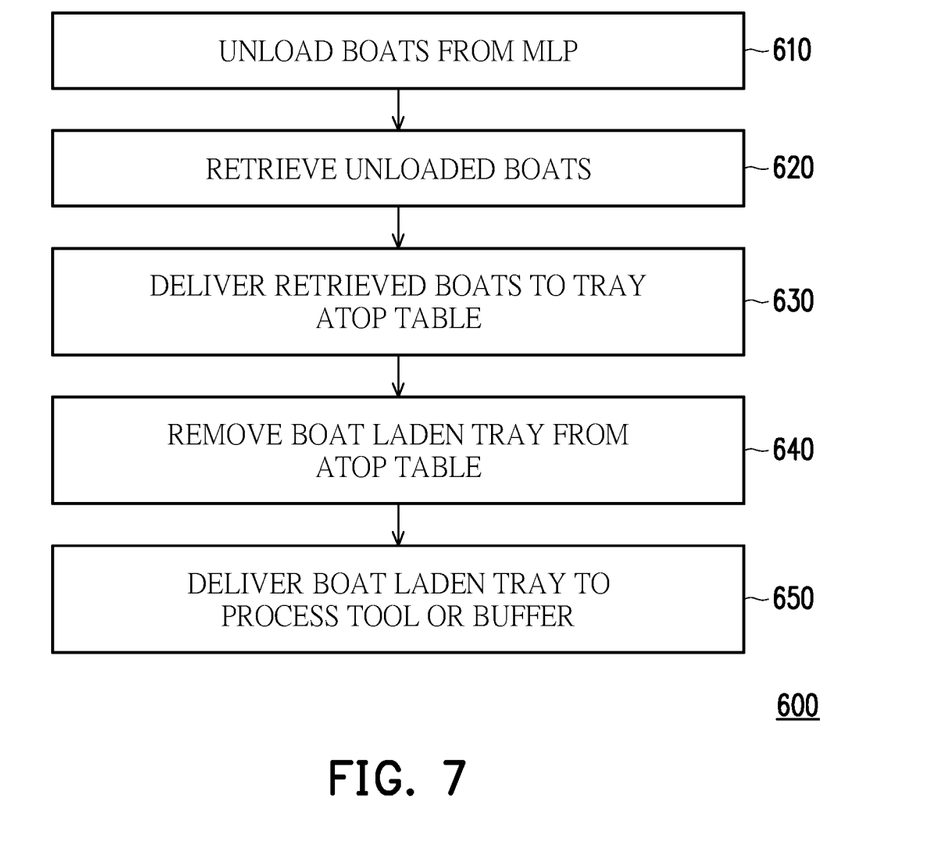
FIG. 7 presents a flow chart showing a method and/or process for handling semiconductor devices in accordance with some embodiments disclosed herein.

With reference now to FIG. 7, there is shown a flow chart that illustrates a semiconductor device handling process 600, for example, which may be carried out with the AMS 100.

In a first step 610, one or more boats 300 carrying more or more semiconductor devices are in turn selectively unloaded from the MLP 100, for example, being sent into one or more of the conveyor lanes 104 to be transported there-along and/or thereby.

In a next step 620, the grippers 108 may be moved along the linear table 106 toward an end of the conveyor lanes 104 where they retrieve the boats 300 therefrom.

In a next step 630, the grippers 108 may be moved along the linear table 106 toward the turn table 110 where they deposit one or more boats 300 in a tray 400 residing or resting on the turn table 110 with the clamping mechanisms 410 of the tray 400 in their disengaged states as a result of the pins 500 on the turn table 110 extending into corresponding clamping mechanisms 410.

In a next step 640, the robot 112 lifts and/or otherwise removes the boat containing tray 400 from the turn table 110. Accordingly, as the tray is lifted and/or removed from the turn table 100, the posts and/or guide pins 500 thereon are removed from the clamping mechanisms 410 and as a result the clamping mechanisms 410 automatically transition from their disengaged states to their engaged states.

In the next step 650, the robot 112 delivers the retrieved tray 400 to one of the process tool 200 or the buffer table 114. In some suitable embodiments, when the tray 400 is delivered to the buffer table 114, it is set down atop thereof, and accordingly, the posts and/or guide pins 500 of the buffer table 114 enter corresponding clamping mechanisms 410 of the tray 400 to thereby cause the clamping mechanisms 410 to automatically transition from their engaged states to their disengaged states.

In some embodiments, the operation of one or more of the various operable elements and/or components of the AHS 100 (for example, such as the MLP 102, the conveyor lanes 104, the linear table 106, the grippers 108 and/or the robot 112) is controlled, regulated and/or coordinated, for example, by a controller to carry out the process 600 and/or other suitable handling of the semiconductor device carrying boats 300 and/or the tray 400. The controller may be implemented via hardware, software, firmware or a combination thereof. In particular, one or more controllers may be embodied by electronic processors (e.g. one or more microprocessors or microcontrollers), electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

In the following, some further illustrative embodiments are described.

In some embodiments, a tray of an automated handling system for transporting semiconductor devices is disclosed. The tray includes: a receiving region that is configured to receive a boat, the boat carrying one or more semiconductor devices thereon; and a clamping mechanism that selectively clamps the boat, residing in the receiving region, to the tray. Suitably, the clamping mechanism is automatically disengaged when the tray is positioned in a designated location and automatically engaged when the tray is not positioned in the designated location, such that, when engaged, the clamping mechanism holds the boat, residing in the boat receiving region, securely within the tray, and when disengaged, the clamping mechanism releases the boat residing in the boat receiving region.

In some further embodiments, the clamping mechanism includes: a movable plunger having a head at a first end thereof; and a biasing member which supplies a mechanical force that urges the plunger in a direction of the head. Suitably, when the clamping mechanism is engaged, the boat, residing within the receiving region of the tray, is pressed upon by the head of the plunger in accordance with the mechanical force supplied by the biasing member, and when the clamping mechanism is disengaged, the plunger is withheld against the mechanical force so that the head of the plunger does not press upon the boat residing within the receiving region of the tray.

In still additional embodiments, when the clamping mechanism is engaged, the boat, residing within the receiving region of the tray, is squeezed between the head of the plunger pressing thereupon and a surface of the tray.

In some embodiments, the biasing member is a spring.

In yet further embodiments, when the tray is positioned at the designated location, the clamping mechanism is held disengaged by a guide pin provided at the designated location, the guide pin cooperating with the clamping mechanism to withhold the plunger against the mechanical force of the biasing member so that the head of the plunger does not press upon the boat residing within the receiving region of the tray.

In some embodiments, the tray includes a plurality of the clamping mechanisms, and a first clamping mechanism of the plurality and a second clamping mechanism of the plurality are coordinated to engage in a non-simultaneous, sequential order when the tray is removed from the designated location.

In some further embodiments, the boat received in the receiving region of the tray has a first side and a second side; the first clamping mechanism is arranged along the first side of the boat when the boat resides in the receiving region and the second clamping member is arranged along the second side of the boat when the boat resides in the receiving region; and when the tray is removed from the designated location, the first clamping mechanism is engaged before the second clamping mechanism is engaged.

In some embodiments, the first side of the boat is shorter than the second side of the boat.

In yet further embodiments, an automated semiconductor device handling system includes: a boat carrying one or more semiconductor devices, the boat having a first side and a second side different than the first side; a table; a tray that is selectively positioned on the table; a first clamp arranged on the tray, said first clamp remaining in a disengaged state while the tray is positioned on the table; a gripper that selectively retrieves the boat and places the retrieved boat in the tray while the tray is positioned on the table with the first clamp in its disengaged state, the boat being placed in the tray by the gripper such that when the boat resides in the tray the first side of the boat is next to the first clamp; and a robot that selectively retrieves and removes the tray from the table with the boat residing in the tray. Suitably, when the tray with the boat residing therein is removed from the table by the robot, the first clamp automatically transitions from its disengaged state to an engaged state in which the first clamp applies a mechanical force that acts on the first side of the boat to hold the boat securely to the tray.

In some embodiments, the system further includes a first post extending from the table, such that when the tray is position on the table, the first post cooperates with the first clamp to hold the first clamp in its disengaged state, and when the tray is removed from the table the first post releases the clamp to automatically transition from its disengaged state to its engaged state.

In some further embodiments, the first clamp includes: a first movable plunger having a first shaft with a first head at one end thereof and a first notch formed in the first shaft, the first shaft extending along a first central axis and the first notch being formed about a second central axis extending normal to the first central axis of the first shaft, the first notch having a first sloped surface extending at a first angle with respect to the second central axis of the first notch; and a first spring that biases the first plunger in a direction of the first head. Suitably, when the tray is positioned on the table, the first pin cooperates with the first notch in the first shaft to withdraw the first plunger against the bias of the first spring in a direction away from the first head, and when the tray with the boat residing therein is removed from the table, the first pin is removed from the first notch in the first shaft thereby freeing the first plunger to act in accordance with the bias applied by the first spring so that the first clamp transitions into its engaged state in which the first head of the first plunger is pressed against the first side of the boat residing in the tray.

In still further embodiments, the system further includes: a second clamp arranged on the tray such that when the boat resides in the tray the second side of the boat is next to the second clamp, the second clamp remaining in a disengaged state while the tray is positioned on the table, and when the tray with the boat residing therein is removed from the table by the robot, the second clamp automatically transitions from its disengaged state to an engaged state in which the second clamp applies a mechanical force that acts on the second side of the boat to hold the boat securely to the tray; and a second post extending from the table, such that when the tray is position on the table, the second post cooperates with the second clamp to hold the second clamp in its disengaged state, and when the tray is removed from the table the second post releases the second clamp to automatically transition from its disengaged state to its engaged state. Suitably, the second clamp includes: a second movable plunger having a second shaft with a second head at one end thereof and a second notch formed in the second shaft, the second shaft extending along a third central axis and the second notch being formed about a fourth central axis extending normal to the third central axis of the second shaft, the second notch having a second sloped surface extending at a second angle with respect to the fourth central axis of the second notch; and a second spring that biases the second plunger in a direction of the second head. Suitably, when the tray is positioned on the table, the second pin cooperates with the second notch in the second shaft to withdraw the second plunger against the bias of the second spring in a direction away from the second head, and when the tray with the boat residing therein is removed from the table, the second pin is removed from the second notch in the second shaft thereby freeing the second plunger to act in accordance with the bias applied by the second spring so that the second clamp transitions into its engaged state in which the second head of the second plunger is pressed against the second side of the boat residing in the tray.

In yet additional embodiments, the first post has a first diameter and the second post has a second diameter, the first diameter being greater than the second diameter.

In some further embodiments, the first angle is greater than the second angle.

In some additional embodiments, the first clamp and the second clamp are coordinated to transition to their engage states in a non-simultaneous, sequential order when the tray is removed from the table by the robot.

In some embodiments, the first side of the boat is shorter than the second side of the boat and the first clamp transitions to its engaged state before the second clamp transitions to its engaged state when the tray is removed from the table by the robot.

In some embodiments, a first spring force of the first spring is less than a second spring force of the second spring.

In some further embodiments, a method of handling semiconductor devices includes: carrying a plurality of semiconductor devices in a boat having a first side and a second side different from the first side; resting a tray on a table, the tray having a first clamping mechanism and a second clamping mechanism arranged thereon which are automatically held, while the tray rests on the table, in disengaged states by first and second pins extending from the table, the first and second pins extending into the first and second clamping mechanisms while the tray rests on the table; placing the boat in the tray while the tray rests on the table such that the first side of the boat is next to the first clamping mechanism and the second side of the boat is next to the second clamping mechanism; and lifting the tray from the table with the boat in the tray. Suitably, when the tray is lifted from the table the first and second pins are removed from the first and second clamping mechanisms freeing the first and second clamping mechanisms to automatically transition from their disengaged states to engaged states in which the first clamping mechanism applies a first force to the first side of the boat and the second clamping mechanism applies a second force to a second side of the boat, thereby securing the boat to the tray.

In yet further embodiments, the first side of the boat is shorter than the second side of the boat; and when the tray is lifted from the table, the transition of first clamping mechanism from the disengage state to the engaged state begins before the transition of the second clamping from its disengaged state to its engaged state.

In still one more embodiment, the first force is applied by a first spring member included in the first clamping mechanism and the second force is applied by a second spring member included in the second clamping mechanism.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An automated handling system for transporting semiconductor devices, comprising:
   a table having a pin; and
   a tray including a well configured to receive a boat, the boat carrying one or more semiconductor devices thereon, and a clamping mechanism that selectively clamps the boat received in the well of the tray, the clamping mechanism including a plunger and a biasing member that applies biasing to the plunger to press the plunger against the boat, the plunger having a notch;
   wherein the plunger of the clamping mechanism is automatically disengaged from the boat when the tray is positioned on the table by the pin of the table engaging the notch of the plunger and moving the plunger away from the boat against the biasing applied by the biasing member, and the clamping mechanism is automatically engaged with the boat by the biasing of the plunger applied by the biasing member when the pin of the table disengages from the notch of the plunger of the clamping mechanism as the tray is removed from the table.

2. The automated handling system of claim 1, wherein: the notch of the plunger of the clamping mechanism has a sloped surface that contacts the pin of the table as the pin engages the notch to guide the notch of the plunger into alignment with the pin of the table, wherein the plunger is disengaged from the boat when the notch of the plunger is aligned with the pin of the table.

3. The automated handling system of claim 1, wherein, when the clamping mechanism is engaged, the boat received in, the well of the tray; is squeezed between the plunger pressing thereupon and a retaining wall of the well of the tray.

4. The tray of claim 1, wherein the biasing member of the clamping mechanism is a spring.

5. The automated handling system of claim 2, wherein the pin of the table has a rounded or tapered end that contacts the sloped surface of the notch of the plunger of the clamping mechanism as the pin engages the notch.

6. The automated handling system of claim 1, wherein the clamping mechanism is a first clamping mechanism, and wherein the tray further includes a second clamping mechanism, wherein the first clamping mechanism and the second clamping mechanism are coordinated to engage in a non-simultaneous, sequential order when the tray is removed from the table.

7. The automated handling system claim 6, wherein:
the boat received in the well of the tray has a first side and a second side;
the first clamping mechanism is arranged along the first side of the boat when the boat is received in the well and the second clamping member is arranged along the second side of the boat when the boat is received in the well; and
when the tray is removed from the table, the first clamping mechanism is engaged before the second clamping mechanism is engaged.

8. The automated handling system of claim 7, wherein said first side is shorter than the second side.

9. An automated semiconductor device handling system, said system comprising:
a boat carrying one or more semiconductor devices, said boat having a first side and a second side different than the first side;
a table;
a tray that is selectively positioned on the table;
a first clamp arranged on the tray, said first clamp remaining in a disengaged state while the tray is positioned on the table, the first clamp comprising a first movable plunger having a first shaft with a first head at one end thereof and a first notch formed in said first shaft, the first shaft extending along a first central axis and the first notch being formed about a second central axis extending normal to the first central axis of the first shaft, said first notch having a first sloped surface extending at a first angle with respect to the second central axis of the first notch, the first clamp further comprising a first spring that biases the first plunger in a direction of the first head;
a gripper that selectively retrieves the boat and places the retrieved boat in the tray while the tray is positioned on the table with the first clamp in its disengaged state, said boat being placed in the tray by the gripper such that when the boat resides in the tray the first side of the boat is next to the first clamp;
a robot that selectively retrieves and removes the tray from the table with the boat residing in the tray; and
a first post extending from said table, such that when the tray is position on the table, the first post cooperates with the first clamp to hold the first clamp in its disengaged state, and when the tray is removed from the table the first post releases the clamp to automatically transition from its disengaged state to its engaged state;
wherein, when the tray with the boat residing therein is removed from the table by the robot, the first clamp automatically transitions from its disengaged state to an engaged state in which the first clamp applies a mechanical force that acts on the first side of the boat to hold the boat securely to the tray; and
wherein, when the tray is positioned on the table, the first post cooperates with the first notch in the first shaft to withdraw the first plunger against the bias of the first spring in a direction away from the first head, and when the tray with the boat residing therein is removed from the table, the first post is removed from the first notch in the first shaft thereby freeing the first plunger to act in accordance with the bias applied by the first spring so that the first clamp transitions into its engaged state in which the first head of the first plunger is pressed against the first side of the boat residing in the tray.

10. The system of claim 9, further comprising:
a second clamp arranged on the tray such that when the boat resides in the tray the second side of the boat is next to the second clamp, said second clamp remaining in a disengaged state while the tray is positioned on the table, and when the tray with the boat residing therein is removed from the table by the robot, the second clamp automatically transitions from its disengaged state to an engaged state in which the second clamp applies a mechanical force that acts on the second side of the boat to hold the boat securely to the tray; and
a second post extending from said table, such that when the tray is position on the table, the second post cooperates with the second clamp to hold the second clamp in its disengaged state, and when the tray is removed from the table the second post releases the second clamp to automatically transition from its disengaged state to its engaged state;
wherein the second clamp comprises:
a second movable plunger having a second shaft with a second head at one end thereof and a second notch formed in said second shaft, the second shaft extending along a third central axis and the second notch being formed about a fourth central axis extending normal to the third central axis of the second shaft, said second notch having a second sloped surface extending at a second angle with respect to the fourth central axis of the second notch; and
a second spring that biases the second plunger in a direction of the second head; and
wherein, when the tray is positioned on the table, the second post cooperates with the second notch in the second shaft to withdraw the second plunger against the bias of the second spring in a direction away from the second head, and when the tray with the boat residing therein is removed from the table, the second post is removed from the second notch in the second shaft thereby freeing the second plunger to act in accordance with the bias applied by the second spring so that the second clamp transitions into its engaged state in which the second head of the second plunger is pressed against the second side of the boat residing in the tray.

11. The system of claim 10, wherein the first post has a first diameter and the second post has a second diameter, the first diameter being greater than the second diameter.

12. The system of claim 10, wherein the first angle is greater than the second angle.

13. The system of claim 10, wherein the first clamp and the second clamp are coordinated to transition to their engage states in a non-simultaneous, sequential order when the tray is removed from the table by the robot.

14. The system of claim 13, wherein the first side of the boat is shorter than the second side of the boat and the first clamp transitions to its engaged state before the second clamp transitions to its engaged state when the tray is removed from the table by the robot.

15. The system of claim 14, wherein a first spring force of the first spring is less than a second spring force of the second spring.

16. A method of handling semiconductor devices, said method comprising:
resting a tray on a table, said tray having a first clamping mechanism and a second clamping mechanism arranged thereon which are automatically held, while the tray rests on the table, in disengaged states by first and second pins extending from the table, said first and second pins extending into notches of spring-biased plungers of the respective first and second clamping mechanisms while the tray rests on the table to retain the spring-biased plungers in the disengaged states;
placing a boat carrying a plurality of semiconductor devices in the tray while the tray rests on the table with a first side of the boat next to the first clamping mechanism and a second side of the boat, different from the first side, next to the second clamping mechanism; and lifting the tray from the table with the boat in the tray, wherein when the tray is lifted from the table the first and second pins are removed from the notches of the spring-biased plungers of the respective first and second clamping mechanisms freeing the spring-biased plungers of the first and second clamping mechanisms to automatically transition from their disengaged states to engaged states in which the spring-biased plunger of the first clamping mechanism applies a first force to the first side of the boat and the spring-biased plunger of the second clamping mechanism applies a second force to a second side of the boat, thereby securing the boat to the tray.

17. The method of claim 16, wherein:
the first side of the boat is shorter than the second side of the boat; and
when the tray is lifted from the table, the transition of first clamping mechanism from the disengaged state to the engaged state begins before the transition of the second clamping from its disengaged state to its engaged state.

18. The method of claim 16, wherein the notches of the spring-biased plungers of the first and second clamping mechanisms have sloped surfaces that contact the respective first and second pins as the pins extend into notches of the spring-biased plungers of the respective first and second clamping mechanisms.

19. The method of claim 18, wherein the sloped surfaces of the notches of the spring-biased plungers of the first and second clamping mechanisms guide the notches of the spring-biased plungers of the first and second clamping mechanisms into alignment with the respective first and second pins as the tray is rested on the table.

20. The method of claim 16, wherein the plurality of semiconductor devices carried by the boat are a plurality of chips diced from a wafer.

* * * * *